United States Patent [19]

Rust et al.

[11] Patent Number: 5,387,868
[45] Date of Patent: Feb. 7, 1995

[54] MAGNETIC RESONANCE APPARATUS

[75] Inventors: Johan W. Rust; Teunis R. Van Heelsbergen, both of Eindhoven, Netherlands

[73] Assignee: U.S. Philips Corporation, New York, N.Y.

[21] Appl. No.: 116,387

[22] Filed: Sep. 2, 1993

[30] Foreign Application Priority Data

Sep. 29, 1992 [EP] European Pat. Off. ............ 92202975

[51] Int. Cl.⁶ ............................................. G01V 3/00
[52] U.S. Cl. .................................... 324/318; 324/322; 128/653.5
[58] Field of Search ............... 324/322, 318, 314, 309, 324/307; 128/653.5

[56] References Cited

U.S. PATENT DOCUMENTS

| | | | |
|---|---|---|---|
| 4,717,881 | 1/1988 | Flugan | 324/322 |
| 4,731,585 | 3/1988 | Fox | 324/322 |
| 4,737,718 | 4/1988 | Kemner et al. | 324/322 |
| 4,816,765 | 3/1989 | Boskakmp | 324/318 |
| 5,144,244 | 9/1992 | Kess | 324/322 |
| 5,166,617 | 11/1992 | Ni | 324/322 |

OTHER PUBLICATIONS

"A Signal-To-Noise Calibration Procedure for NMR Imaging Systems" W. A. Edelstein et al, Medical Physics, vol. 11, No. 2, Mar. 1, 1984.
"Simulation of Patient Loading in Nuclear Magnetic Resonance Imaging Through the Use of Inductive Damping Loops" Jennings et al, the British Journal of Radiology 1986, pp. 1031-1034.

*Primary Examiner*—Louis Arana
*Attorney, Agent, or Firm*—Jack D. Slobod

[57] ABSTRACT

In magnetic resonance apparatus in a magnet system (1) for generating a steady magnetic field, a coil system (3) for generating gradient fields, and at least one RF coil (9) which is tuned to a predetermined frequency and connected to first and second input terminals (53, 55) of an input amplifier circuit (43) of a receiving device (13) for RF order to enable simulation of the loading of the RF coil (9) by a patient during installation and testing of the operation of the apparatus without utilizing a load phantom, the circuit formed by the RF coil (9) and the input amplifier circuit (43) comprises a load network (61 ). In one embodiments first and second input terminals (53, 55) of the input amplifier circuit (43) are interconnected via the load network (61) which comprises a series connection of a switch (63) and a resistor (65). The switch is preferably formed by a diode (63), one electrode of which is connected to one of the input terminals (53) of the input amplifier circuit (43), its other electrode being connected to one end of the resistor (65), the other end of which is connected to the other input terminal (55) via a capacitor (73). The junction point of the resistor (65) and the capacitor (73) is connected to a control terminal (71) whereto a positive or a negative direct voltage, relative to the first input terminal (53), can be applied as desired in order to set the diode (63) to a conductive state or a blocked state.

14 Claims, 2 Drawing Sheets

MAGNETIC RESONANCE APPARATUS

BACKGROUND OF THE INVENTION

1. FIELD OF THE INVENTION

The invention relates to a magnetic resonance apparatus, comprising a magnet system for generating a steady magnetic field, a coil system for generating gradient fields, and at least one RF coil which comprises a circuit with at least a self-inductance and a tuning capacitor, which circuit is tuned to a predetermined frequency and connected to first and second input terminals of an input amplifier of a receiving device for RF signals.

2. DESCRIPTION OF THE RELATED ART

An apparatus (MR apparatus) of this kind is known from, for example U.S. Pat. No. A-4,737,718. Apparatus of this kind are customarily delivered together with a set of phantoms which can be used to check the imaging quality of the RF coils and the entire MR chain. The phantoms serve to simulate the presence of an object to be examined, for example a patient. They are used during installation of the apparatus, during fault-finding in the MR chain, during adjustment of the RF coils and the MR chain, and during image quality tests to be performed at regular intervals. A phantom usually consists of two segments, that is to say on the one hand a segment containing elements which can be imaged by the MR apparatus and which can serve to measure parameters which are decisive in respect of the image quality (for example, signal-to-noise ratio and uniformity), and on the other hand a segment which simulates the loading of the RF coil by the patient. This is because said parameters are co-determined by the coil quality Q arising from the RF coil itself and the coil load caused by the patient. Thus far, the load segment is customarily constructed as an annular vessel which is filled with an electrically conductive liquid (for example a saline solution) or as a closed circuit which can be inductively coupled to the RF coil and which may comprise, for example a coil, a resistor and a capacitor. Examples of such load phantoms are described in The British Journal of Radiology, 59, pp. 1031–1034. Generally speaking, a separate load phantom is required for each RF coil associated with the MR apparatus. The known phantoms of the described constructions are often comparatively voluminous, complex and difficult to handle. Moreover, they may be vulnerable and expensive.

SUMMARY OF THE INVENTION

It is an object of the invention to provide a magnetic resonance apparatus which does not require the supply of load phantoms for the various RF coils. To achieve this, the apparatus in accordance with the invention is characterized in that the circuit formed by the RF coil and the input amplifier circuit includes a load network which comprises at least a switch and a resistor which can be coupled to the RF coil by means of said switch.

In an apparatus of this kind, the loading by the patient can be very simply simulated by closing the switch so that the resistor is connected parallel to the input of the input amplifier. The load network may form part of the RF coil so that when a new RF coil is fitted, the associated load network is automatically present. Thus, it is no longer necessary to supply voluminous and expensive load phantoms with the RF coils and the mounting of such phantoms in the coils can also be dispensed with. Therefore, such mounting can no longer be forgotten and, moreover, positioning errors can no longer occur during mounting.

A first embodiment of the apparatus in accordance with the invention is characterized in that the first and second input terminals of the input amplifier circuit are interconnected via the load network, the load network comprising at least a first series connection of a first switch and a first resistor. The first switch is preferably formed by a first diode, one electrode of which is connected to one of the input terminals of the input amplifier circuit, its other electrode being connected to an end of the first resistor whose other end is connected to the other input terminal via a first capacitor, the junction point of the first resistor and the first capacitor also being connected to a control terminal whereto a positive or a negative direct voltage, relative to the first input terminal, can be applied as desired. The load network can thus be switched on or off by choosing the control voltage to be applied to the control terminal. The diode is preferably a so-called PIN diode as customarily used for switching on and off elements of RF coils in MR apparatus.

A further embodiment is characterized in that the load network also comprises a second series connection of a second switch and a second resistor, which series connection is connected, at least for RF signals, parallel to the first series connection. In this embodiment, both resistors can be simultaneously switched on or off by choosing the control voltage.

In many cases an object to be measured which is coupled to the RF coil not only causes a reduction of the coil quality, as can be simulated by the above first and second resistors, but also a frequency shift. This frequency shift can be simulated in a further embodiment which is characterized in that an impedance of a capacitive or inductive nature is connected parallel to at least one of the first and second resistors.

A second embodiment of the apparatus in accordance with the invention is characterized in that the load network comprises a parallel connection of a switch and a resistor, which parallel connection is included in the circuit forming the RF coil.

BRIEF DESCRIPTION OF THE DRAWING

These and other aspects of the invention will be described in detail hereinafter with reference to the drawing; wherein.

DETAILED DESCRIPTION OF THE PREFERRED EMBODIMENTS

Figure 1:
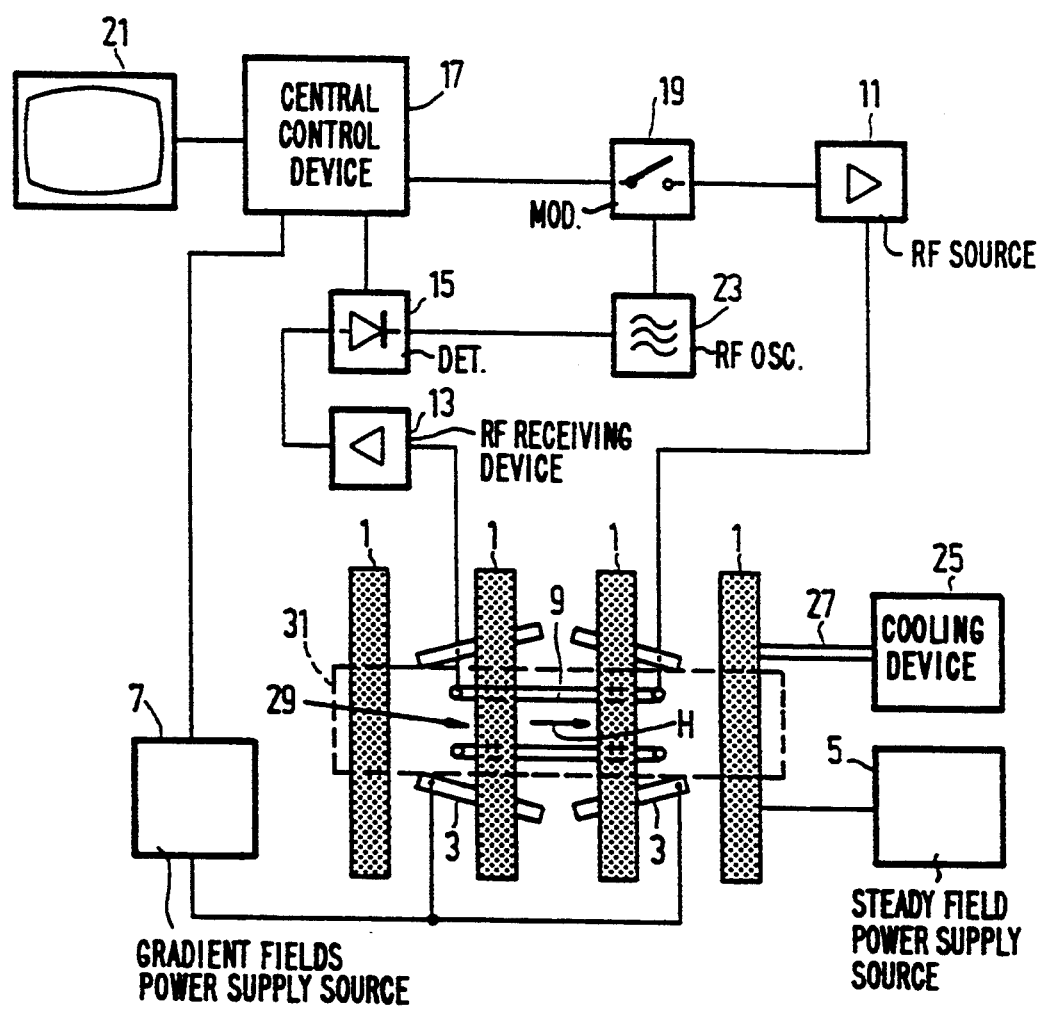
FIG. 1 shows diagrammatically an embodiment of a magnetic resonance apparatus in accordance with the invention.

The magnetic resonance apparatus which is diagrammatically shown in FIG. 1 comprises a first magnet system 1 for generating a steady magnetic field H, a second magnet system 3 for generating magnetic gradient fields, and first and second power supply, sources 5 and 7 for the first magnet system 1 and the second magnet system 3, respectively. An RF coil 9 serves to generate an RF magnetic alternating field; to this end, it is connected to the output of an RF source 11. For detection of nuclear spin resonance signals generated by the RF transmitted field in an object to be examined (not shown), use can also be made of the RF coil 9; to this end, this coil is connected input of a receiving device 13 for receiving RF signals. The output of the receiving device 13 is connected to a detector circuit 15 which is connected to a central control device 17. The central control device 17 also controls a modulator 19 feeding the RF source 11, the second power supply source 7, and a monitor 21 for image display. An RF oscillator 23 controls the modulator 19 as well as the detector 15 processing the measurement signals. For cooling, if any, of the magnet coils of the first magnet system 1 there is provided a cooling device 25 comprising cooling ducts 27. A cooling device of this kind may be constructed as a water-cooling system for resistive coils or, as for the high field strengths required in the present case, for example, as a liquid-helium cooling system for superconducting magnet coils. The RF coil 9, arranged within the magnet systems 1 and 3, encloses a measurement space 29 which is large enough to accommodate the patient to be examined, or a part of the patient to be examined, for example the head and the neck, in an apparatus for medical diagnostic measurements. Thus, in the measurement space 29 there can be generated a steady magnetic field H, gradient fields for selecting object slices, and a spatially uniform RF alternating field. The RF coil 9 can combine the functions of transmitter coil and measuring coil. Alternatively, different coils can be used for the two functions; for example, the measuring coils can be constructed as surface coils or butterfly coils, see U.S. Pat. No. A-4,816,765 or as bird cage coils, see U.S. Pat. No. 4,737,718. Hereinafter, the RF coil 9 will be referred to only as a measuring coil. If desired, the coil 9 may be enclosed by a Faraday cage 31 shielding RF fields.

Figure 2:
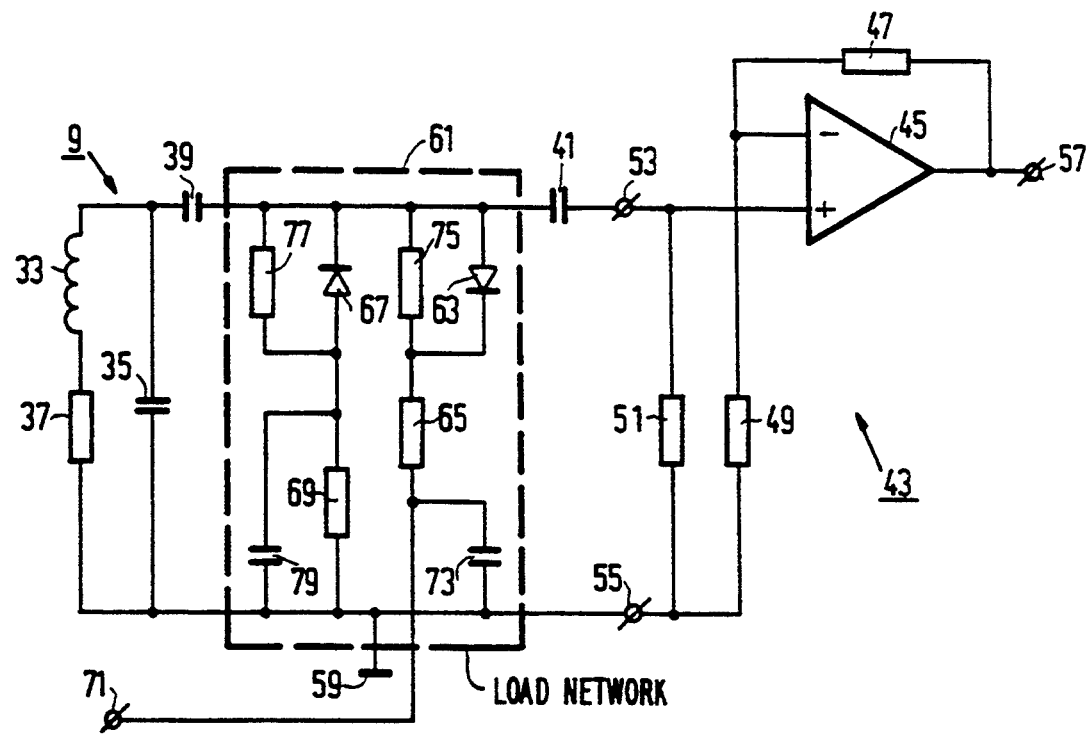
FIG. 2 shows an electric circuit diagram of a part of a first embodiment of the apparatus shown in FIG. 1.

FIG. 2 shows a circuit diagram of the RF coil 9 and a part of the receiving device 13. As is customary, the RF coil 9 comprises a circuit, tuned to a predetermined frequency, with a pure self-inductance 33, a tuning capacitor 35 and a loss resistor 37. Via two series-connected coupling capacitors 39 and 41, the RF coil 9 is connected to an input amplifier circuit 43 of the receiving device 13. In the present embodiment, the input amplifier circuit 43 comprises an operational amplifier 45 which is set by means of (very high-ohmic) resistors 47, 49 and 51. The input amplifier circuit 43 may also comprise other elements which are known per se, for example a network of coils and capacitors. It comprises first and second input terminals 53 and 55 and an output terminal 57. The first input terminal 53 is connected, via the two coupling capacitors 39 and 41, to a first end of the RF coil 9, and the second input terminal 55 is connected to the other end of the RF coil and to a reference point 59 of fixed potential. The output terminal 57 is connected to further parts of the receiving device 13 or directly to the detector 15.

Between the junction point of the two coupling capacitors 39 and 41 on the one side and the reference point 59 on the other side there is connected a load network 61 which thus constitutes a connection between the first and the second input terminals 53 and 55 of the input amplifier 43. The load network 61 comprises a first series connection of a first switch 63 and a first resistor 65, and also a second series connection of a second switch 67 and a second resistor 69. In the present embodiment, the first and the second switches 63 and 67 are formed by first and second diodes, preferably PIN diodes. The anode of the first diode 63 and the cathode of the second diode 67 are connected (via the coupling capacitor 41) to the first input terminal 53, the other electrodes of these diodes being connected to one end of the first resistor 65 and the second resistor 69, respectively. The other end of the first resistor 65 is connected to a control terminal 71 and to an electrode of a capacitor 73, the other electrode of which is connected to the reference point 59. The other end of the second resistor 69 is connected directly to the reference point 59. A positive or negative direct voltage, relative to the reference point 59, can be applied, as desired, to the control terminal 71 via switching means (not shown). If the applied direct voltage (referred to hereinafter as control voltage) is positive, for example +300V, both diodes 63, 65 are blocked so that the load network 61 has no effect on the quality Q of the RF coil 9. This is the state which occurs when the apparatus is used for a normal measurement. During the testing of the apparatus, for example upon installation or after replacement of coils and other parts of the MR chain, a negative control voltage of, for example $-10$ V is applied, so that both diodes 63, 67 become conductive. The diodes thus act as switches which, in the conductive state, connect one end of the first and the second resistors 65, 69, to the first input terminal 53 and hence also to the RF coil 9. The other end of the first resistor 65 is connected, via the capacitor 73, to the second input terminal 55 whereas the other end of the second resistor 69 is connected directly to the second input terminal, so that for RF signals these two resistors are connected in parallel and interconnect the two input terminals. They thus constitute a load resistance for the RF coil 9 which simulates a coil load caused by a patient. For direct voltages, the first resistor 65, the two diodes 63, 67 and the second resistor 69 are connected in series between the control terminal 71 and the reference point 59. In order to distribute the reverse voltage uniformly between the two diodes 63, 67 in the case of a positive control voltage, a resistor 75, 77 is connected parallel to each of these diodes. The values of these resistors are preferably equal and very high.

If desired, like in the embodiment shown, a frequency shift caused by the presence of the patient can also be simulated by connecting an impedance 79 parallel to the second resistor 69. In the present example the impedance 79 simply consists of a capacitor, so that the impedance is of a capacitive nature. A shift to a lower frequency is thus simulated, which shift has been found to occur most frequently in practice. A frequency shift to higher values could be simulated by an impedance 79 of an inductive nature, for example by replacing the capacitor by a coil.

Various alternative versions are feasible for the described embodiment. For example, it may suffice to use only one series connection of a switch and a resistor. To this end, for example the second series connection (of the second diode 67 and the second resistor 69) may be omitted, the anode of the first diode then being connected, via a high-ohmic resistor, to the reference point 59 in order to realise a closed circuit for the control signal to be applied via the control terminal 71. It is alternatively possible to connect the first diode 63 between an end of the first resistor 65 and the second input terminal 55 and to apply the control voltage via the other end of said resistor. Said other end should then be connected, via a capacitor such as the capacitor 73, to the first input terminal 53 in order to ensure that for RF signals the resistor can be connected parallel to the input of the amplifier 43. The switches 63 and 67 may also be formed by other, known switching elements, for example transistors, instead of PIN diodes. If desired, the first and second resistors 65, 69 and the impedance 79 may be constructed so as to be variable. The load circuit 69 can be combined with the RF coil 9 so as to form one structural unit.

If desired, the control voltage can be applied via a high self-inductance or via an RF rejection filter, comprising a parallel connection of a self-inductance and a capacitor. In that case complete isolation for RF signals exists between the control voltage source and the load network 61.

Figure 3:
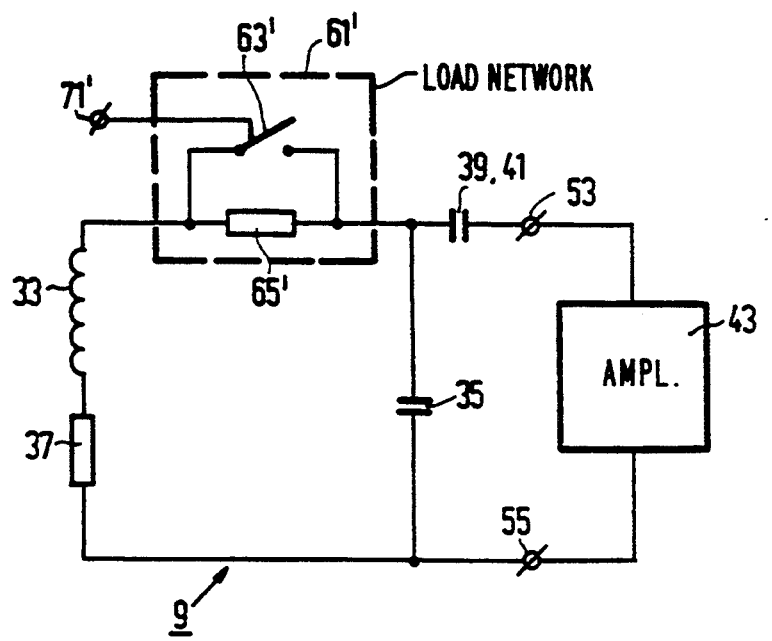
FIG. 3 shows an electric circuit diagram of a part of a second embodiment of the apparatus shown in FIG. 1.

FIG. 3 shows an embodiment in which the load network 61' comprises a parallel connection of a switch 63' and a resistor 65'. This parallel connection is included in the circuit forming the RF coil 9. The switch 61' can be opened or closed by applying a suitable control voltage to the control terminal 71'. When the switch is open, the resistor 65' is connected in series with the loss resistor 37 and, when the switch is closed, the resistor is short-circuited. Thus, like in the first embodiment, the resistor 65' can be coupled to the RF coil 9 by means of the switch 63'. Various embodiments are feasible for the switch 63' and the resistor 65', analogous to the description given with reference to FIG. 2.

We claim:

1. A magnetic resonance apparatus, comprising a magnet system for generating a steady magnetic field, a coil system for generating gradient fields, and at least one RF coil which comprises a circuit with at least a self-inductance and a tuning capacitor, which circuit is tuned to a predetermined frequency and connected to first and second input terminals of an input amplifier circuit of a receiving device for RF signals, the circuit formed by the RF coil and the input amplifier circuit including means for selectively simulating loading of said RF coil due to an object under examination, said simulating means comprising a load network which comprises at least a switch and a resistor which can coupled to the RF coil by means of said switch.

2. A magnetic resonance apparatus as claimed in claim 1, wherein the first and second input terminals of the input amplifier circuit are interconnected via the load network, the load network comprising at least a first series connection of a first switch and a first resistor.

3. A magnetic resonance apparatus as claimed in claim 2, wherein the first switch is formed by a first diode, one electrode of which is connected to one of the input terminals of the input amplifier circuit, its other electrode being connected to one end of the first resistor, whose other end is connected to the other input terminal via a first capacitor, the junction point of the first resistor and the first capacitor also being connected to a control terminal whereto a positive or a negative direct voltage, relative to the first input terminal can be applied as desired.

4. A magnetic resonance apparatus as claimed in claim 2, wherein the load network also comprises a second series connection of a second switch and a second resistor, which series connection is connected, at least for RF signals, parallel to the first series connection.

5. A magnetic resonance apparatus as claimed in claim 4, wherein the anode of the first diode and the cathode of the second diode are connected to the first input terminal of the input amplifier circuit.

6. A magnetic resonance apparatus as claimed in claim 4 wherein an impedance of a reactive nature is connected parallel to at least one of the first and second resistors.

7. A magnetic resonance apparatus as claimed in claim 1, wherein the load network comprises a parallel connection of a switch and a resistor, which parallel connection is included in the circuit forming the RF coil.

8. A magnetic resonance apparatus as claimed in claim 3, wherein the load network also comprises a second series connection of a second switch and a second resistor, which series connection is connected, at least for RF signals, parallel to the first series connection.

9. A magnetic resonance apparatus as claimed in claim 8, wherein the anode of the first diode and the cathode of the second diode are connected to the first input terminal of the input amplifier circuit.

10. A magnetic resonance apparatus as claimed in claim 8, wherein an impedance of a reactive nature is connected parallel to at least one of the first and second resistors.

11. A magnetic resonance apparatus as claimed in claim 9, wherein an impedance of a reactive nature is connected parallel to at least one of the first and second resistors.

12. A magnetic resonance apparatus as claimed in claim 2, wherein an impedance of a reactive nature is connected parallel to the first resistor.

13. A magnetic resonance apparatus as claimed in claim 3, wherein an impedance of a reactive nature is connected parallel to the first resistor.

14. A magnetic resonance apparatus as claimed in claim 9, wherein an impedance of a reactive nature is connected parallel to the first resistor.

* * * * *